(12) United States Patent
Liu et al.

(10) Patent No.: US 8,709,929 B2
(45) Date of Patent: Apr. 29, 2014

(54) METHODS OF FORMING SEMICONDUCTOR DEVICES HAVING DIFFUSION REGIONS OF REDUCED WIDTH

(75) Inventors: Lequn Liu, Boise, ID (US); Yongjun Jeff Hu, Boise, ID (US); Anish A. Khandekar, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 13/604,411

(22) Filed: Sep. 5, 2012

(65) Prior Publication Data

US 2012/0329258 A1 Dec. 27, 2012

Related U.S. Application Data

(62) Division of application No. 12/562,635, filed on Sep. 18, 2009, now Pat. No. 8,283,708.

(51) Int. Cl.
*H01L 21/265* (2006.01)
*H01L 29/78* (2006.01)

(52) U.S. Cl.
USPC ........... 438/533; 438/301; 438/514; 257/122; 257/E21.632; 257/E29.255

(58) Field of Classification Search
USPC .......................... 257/288, E29.255, E21.409
See application file for complete search history.

(56) References Cited

U.S. PATENT DOCUMENTS

| 6,828,234 | B2 | 12/2004 | Tam et al. |
| 2005/0139875 | A1 | 6/2005 | Kim |
| 2005/0142821 | A1 | 6/2005 | Kim |
| 2007/0187736 | A1 | 8/2007 | Akiyama et al. |
| 2007/0259527 | A1 | 11/2007 | Chou et al. |
| 2009/0001526 | A1 | 1/2009 | Feustel et al. |
| 2009/0294866 | A1 | 12/2009 | Eller et al. |
| 2011/0068378 | A1 | 3/2011 | Liu et al. |

*Primary Examiner* — Mamadou Diallo
(74) *Attorney, Agent, or Firm* — TraskBritt

(57) ABSTRACT

Semiconductor devices and methods for forming semiconductor devices are provided, including semiconductor devices that comprise one or more diffusion regions in a semiconductor, the one or more diffusion regions being adjacent to a gate formed adjacent to a surface of the semiconductor (e.g., a semiconductor substrate). The one or more diffusion regions comprise a first width at a depth below the surface of the semiconductor and a second width near the surface of the semiconductor, the second width of the one or more diffusion regions being less than about 40% greater than the first width.

19 Claims, 9 Drawing Sheets

METHODS OF FORMING SEMICONDUCTOR DEVICES HAVING DIFFUSION REGIONS OF REDUCED WIDTH

CROSS-REFERENCE TO RELATED APPLICATION

This application is a divisional of U.S. patent application Ser. No. 12/562,635, filed Sep. 18, 2009, now U.S. Pat. No. 8,283,708, issued Oct. 9, 2012, the disclosure of which is hereby incorporated herein in its entirety by this reference.

TECHNICAL FIELD

Embodiments of the present disclosure relate generally to memory devices.

BACKGROUND

Memory devices are formed for various purposes including, for example, internal storage areas in computers, personal media players, cameras, and other electronic devices. The term, "memory" identifies data storage that typically comes in the form of integrated circuit chips. In general, memory devices contain an array of memory cells for storing data, and row and column decoder circuits coupled to the array of memory cells for accessing the array of memory cells in response to an external address. One type of memory cell utilizes transistors capable of storing a charge. Such transistors typically comprise a pair of diffusion regions, referred to as a source and a drain, spaced apart and within a semiconductor, for example, a semiconductive substrate, such as a bulk single crystal silicon wafer. The transistors also include a gate provided adjacent to the semiconductor and between the diffusion regions for imparting an electric field to enable current to flow between the diffusion regions.

FIG. 1 is a schematic view of an example of a NAND Flash memory device 100. As shown, the memory device 100 includes a plurality of active areas 110 forming an array, each active area 110, extending longitudinally along a substrate 120 and separated from each other by isolation regions 130 (e.g., shallow trench isolation (STI) regions). The active areas 110 comprise a plurality of diffusion regions at least in regions between access lines, which are commonly referred to as wordlines, such as wordlines 140. Wordlines 140 extend across a plurality of the active areas 110 and comprise control gates. The wordlines 140 are grouped together in blocks that typically comprise thirty-two (32) wordlines, although only five (5) wordlines are shown in each of the two blocks illustrated in FIG. 1 due to space limitations. On one side of each block is a gate 140' configured as a drain select line, and on another side of each block is a gate 140" configured as a source select line, each of which is configured to select a block of wordlines for reading from and writing to the memory device 100. A source slot 165 can be at one end of a block and a plurality of data line contacts, such as bit contacts 170, are at an opposing end of each block. The bit contacts 170 are coupled to the active areas 110 and to a data line, such as bitline 180, of a plurality of data lines.

Use of conventional processes to form a memory device, such as that shown in FIG. 1, may result in an increase in the width of the diffusion regions at an end thereof that is proximal to the surface of the substrate 120. For example, FIG. 2 illustrates a partial cross-sectional view of the memory device 100 of FIG. 1 taken along a portion of section line 2-2 and showing a plurality of active areas 110 of the memory device 100 coupled to bit contacts 170. As discussed above, each of the active areas 110 of the plurality of active areas 110 is electrically isolated from other active areas 110 by isolation regions, such as shallow trench isolation (STI) regions 130 between the active areas 110. The active areas 110 have a width 210 at a depth (e.g., about 30-40 nanometers or more) from the surface of the substrate 120. However, conventional active areas 110 may also include a diffusion region comprising an end 220 proximate the active surface of the substrate 120 having a width 230 that is larger than the width 210 of the active area 110. Such an increase in width may be caused by, for example, unintended nucleation and growth of new crystals in the semiconductor material, and typically occurs during the manufacturing process.

The increase in width between widths 210 and 230 in the end 220 of the active areas 110 proximate the active surface of the substrate 120 may also be referred to in this disclosure as a "mushroom" or "mushrooming." As used herein the term "mushroom" or "mushrooming" is intended to describe the nucleation and growth of new crystals in diffusion regions of a single crystal semiconductor substrate resulting in enlargement in width of the diffusion regions. Mushrooming becomes problematic as semiconductor devices are scaled to increasingly smaller dimensions. For example, the increase in width associated with the so-called "mushroom" can result in short circuits between active areas 110 that are typically separated by STI regions 130, and present an obstacle in reducing the pitch between active areas in relation to reducing the overall size of semiconductor devices.

BRIEF DESCRIPTION OF THE DRAWINGS

FIG. 4A is a cross-sectional elevation view of a portion of a memory array of a semiconductor device during a stage of fabrication according to at least one embodiment of the disclosure.

FIG. 4B is a cross-sectional elevation view of the portion of the memory array shown in FIG. 4A during another stage of fabrication according to at least one embodiment of the disclosure.

FIG. 4C is a cross-sectional elevation view of the portion of the memory array shown in FIGS. 4A and 4B during another stage of fabrication according to at least one embodiment of the disclosure.

FIG. 4D is an isometric sectional view of a semiconductor device resulting from the method of FIG. 3 and illustrating the substrate with a block of thirty-two (32) wordlines and a plurality of active areas that include diffusion regions between the wordlines.

FIG. 4E is a partial view of a cross-section of the substrate of FIG. 4D taken along plane 4E-4E and illustrating some of the active areas.

FIG. 7A is a cross-sectional elevation view of a portion of a memory array of a semiconductor device during a stage of fabrication according to at least one embodiment of the disclosure.

FIG. 7B is a cross-sectional elevation view of the portion of the memory array of FIG. 7A during another stage of fabrication according to at least one embodiment of the disclosure.

FIG. 7C is a cross-sectional elevation view of the portion of the memory array of FIGS. 7A and 7B during another stage of fabrication according to at least one embodiment of the disclosure.

FIG. 7D is a partial view of a cross-section of a substrate similar to FIG. 4E, which is taken along the plane 4E-4E in FIG. 4D and illustrates some of the active areas therein.

DETAILED DESCRIPTION

The illustrations presented herein are, in some instances, not actual views of any particular transistor, semiconductor substrate, or semiconductor device, but are merely idealized representations that are employed to describe the present disclosure. Additionally, elements common between figures may retain the same numerical designation.

Figure 3:
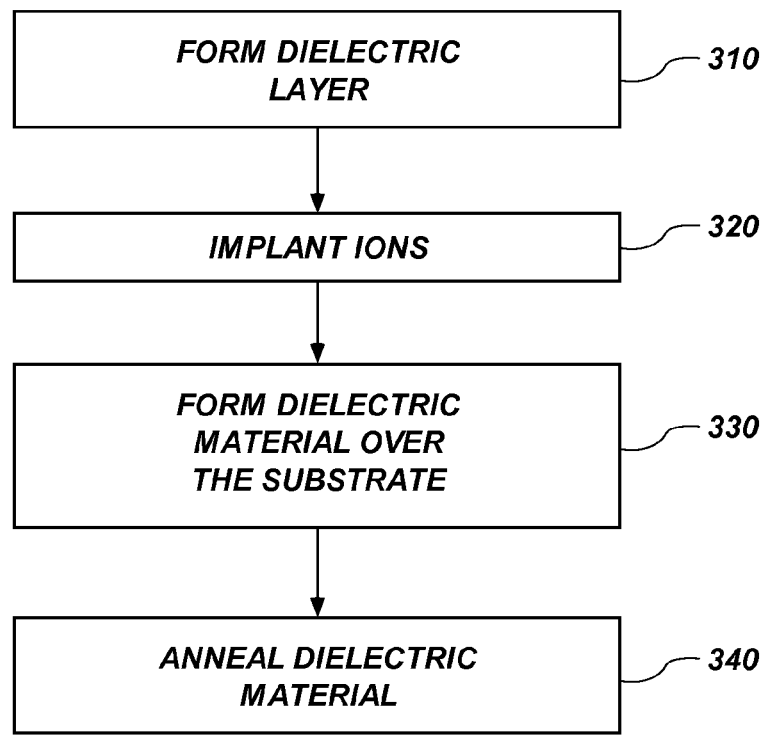
FIG. 3 is a flow diagram illustrating the process flow of an embodiment of a method of the present disclosure.
Figure 4A:
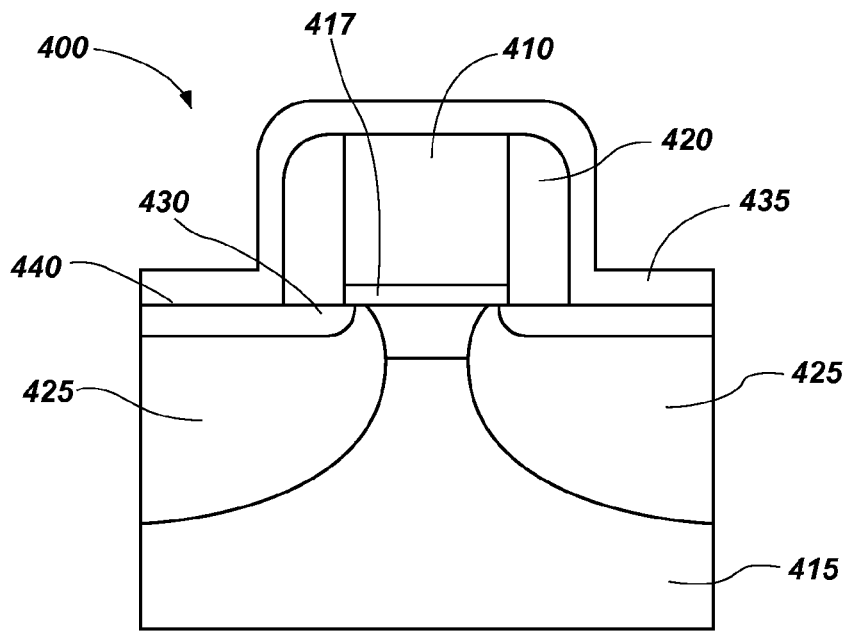
FIGS. 4A through 4E are cross-sectional schematic views of the portion of FIG. 1 indicated as FIG. 4A according to an embodiment including a gate and an active area comprising a diffusion region on each side of the gate and illustrating the associated structures formed during the method of FIG. 3.

Various embodiments of the present disclosure comprise methods for forming memory devices having reduced or substantially eliminated mushrooming. Process flow of an embodiment of a method of the present disclosure is illustrated in FIG. 3, and the associated structures formed during the process are illustrated in FIGS. 4A through 4E. FIG. 4A is a cross-sectional elevation view of a portion of an N-channel transistor, such as one used to form a control gate, a drain select line or a source select line, of a semiconductor device 400 during a stage of fabrication after several processing steps have occurred according to an embodiment of the present disclosure. Formation of the structure depicted in FIG. 4A is known to those of ordinary skill in the art and will not be detailed herein. In general, a gate 410 is formed adjacent to a semiconductor, such as semiconductor substrate 415, for example of silicon, such as a single crystal silicon substrate. For example, the gate 410 may comprise N+ polycrystalline silicon (or "polysilicon") over the substrate 415, and separated therefrom by a gate oxide 417. The semiconductor device 400 may include a spacer 420 formed on lateral sides of the gate 410, and the substrate 415 may include a plurality of halo implant regions 425 and lightly doped drain (LDD) implant regions 430, such as the P halo and N-LDD region of an N-channel transistor formed in the substrate 415. Fewer, additional or different conventional features may also be formed in, on or over the substrate 415 to form different embodiments of semiconductor devices.

Referring to the drawing figures, in act 310 (FIG. 3), an oxide, such as oxide layer 435 (FIG. 4A), is formed over the gate 410 and the substrate 415. The oxide layer 435 may be formed as a screening oxide, which may serve to protect the substrate 415 from residual ions on the surface 440 of the substrate 415 after ion implantation, as described in detail herein below. The oxide layer 435 may comprise an oxide film such as silicon dioxide having an average thickness of about 15 nanometers. The oxide layer 435 may be formed by conventional methods including, for example, chemical vapor deposition (CVD) using tetraethyl orthosilicate (TEOS deposition or furnace TEOS deposition). Prior to forming the oxide layer 435, the surface 440 of the substrate 415 may be cleaned as is generally known in the art.

Figure 1:
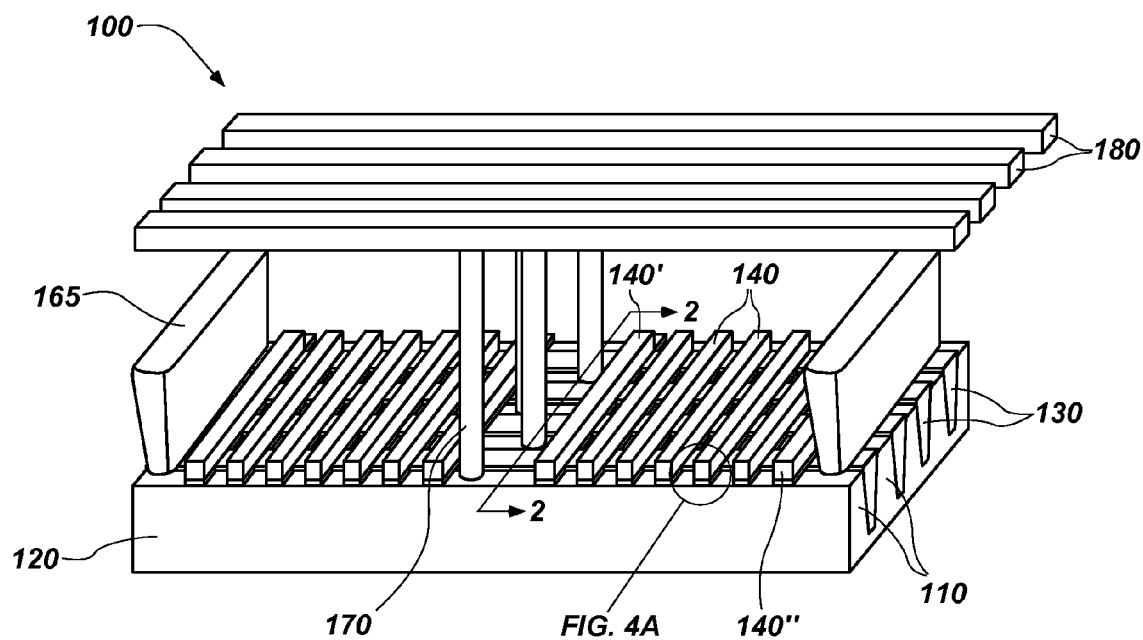
FIG. 1 is a schematic view of an example of a NAND Flash memory device.
Figure 2:
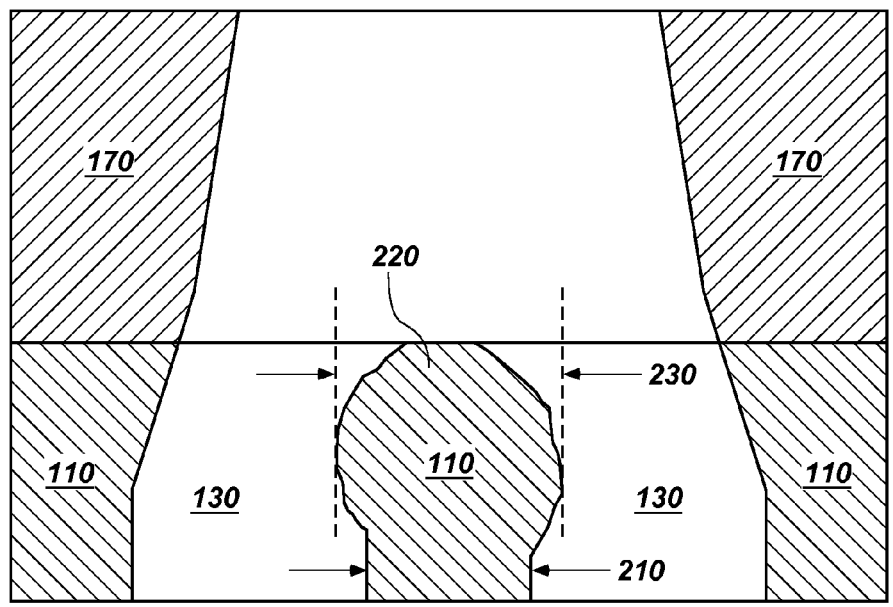
FIG. 2 illustrates a partial cross-sectional view of the memory device of FIG. 1 taken along a portion of section line 2-2 and showing a plurality of active areas of the memory device coupled to bit contacts.
Figure 4B:
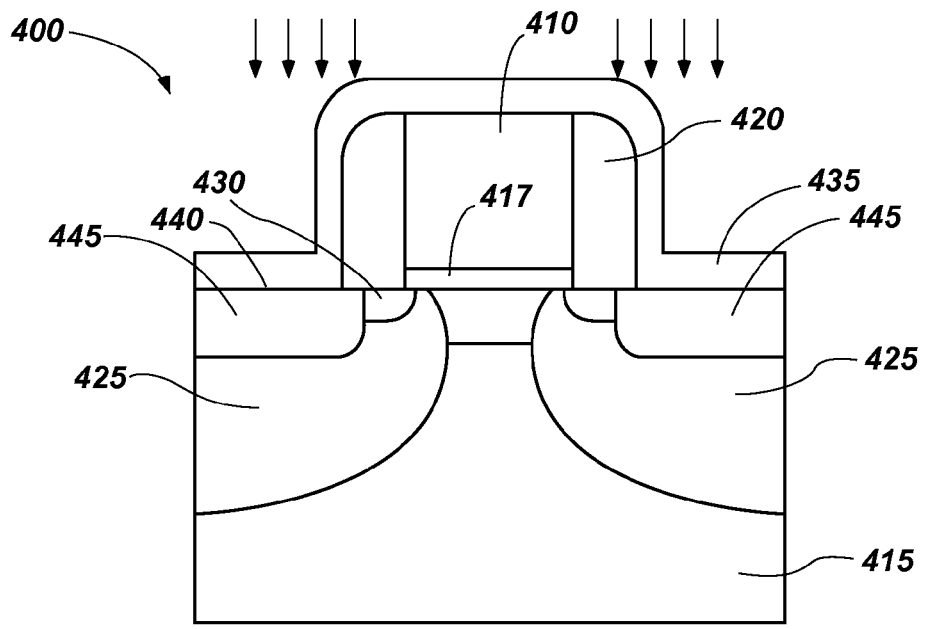

In act 320 (FIG. 3), and with reference to FIG. 4B, ions are implanted into selected regions of the substrate 415, completing the formation of the sources and drains. The ion implantation may comprise a relatively shallow implant of a large number (i.e., a high-dose) of ions to complete formation of diffusion regions 445. The ion implantation is accomplished using ion implantation equipment and techniques known in the art. Generally, a mask (not shown) may be formed and patterned over the substrate 415, including the oxide layer 435, with a plurality of openings formed therein to selectively specify the locations for a plurality of diffusion regions 445. An ion beam is directed at the substrate 415 and the ions of the ion beam are provided with sufficient energy to cause the ions to penetrate through the oxide layer 435 and be implanted within the substrate 415 to a shallow depth and with a high concentration to provide an excess of current carriers. As a result, the diffusion regions 445 are electrically conductive. By way of example and not limitation, the ion beam may comprise Arsenic or $BF_2$ (depending on whether it is an N-channel or P-channel transistor) and may be directed at the substrate 415 at an energy level greater than about 30 KeV. In some embodiments, the ion beam may be directed at the substrate 415 at an energy level between about 50 KeV and 60 KeV. The mask formed on the surface 440 may be removed after the ions are implanted into the diffusion regions 445. The resulting structure after act 320 may comprise one or more diffusion regions 445 formed in the substrate 415 and adjacent to the gate 410. The diffusion regions 445 may comprise the sources and drains of the transistors. Although the embodiment shown in FIG. 4B illustrates a diffusion region 445 on either side of the gate 410, the present disclosure is not so limited. Indeed, according to various embodiments, one or more gates 410 of a semiconductor device 400 (e.g., gates 140' and 140" in FIG. 1) may comprise only a single diffusion region 445 on one side thereof while other gates 410 of a semiconductor device 400 (e.g., gates 140 in FIG. 1) may only have LDD regions 430 and no diffusion regions 445 adjacent thereto.

Figure 4C:
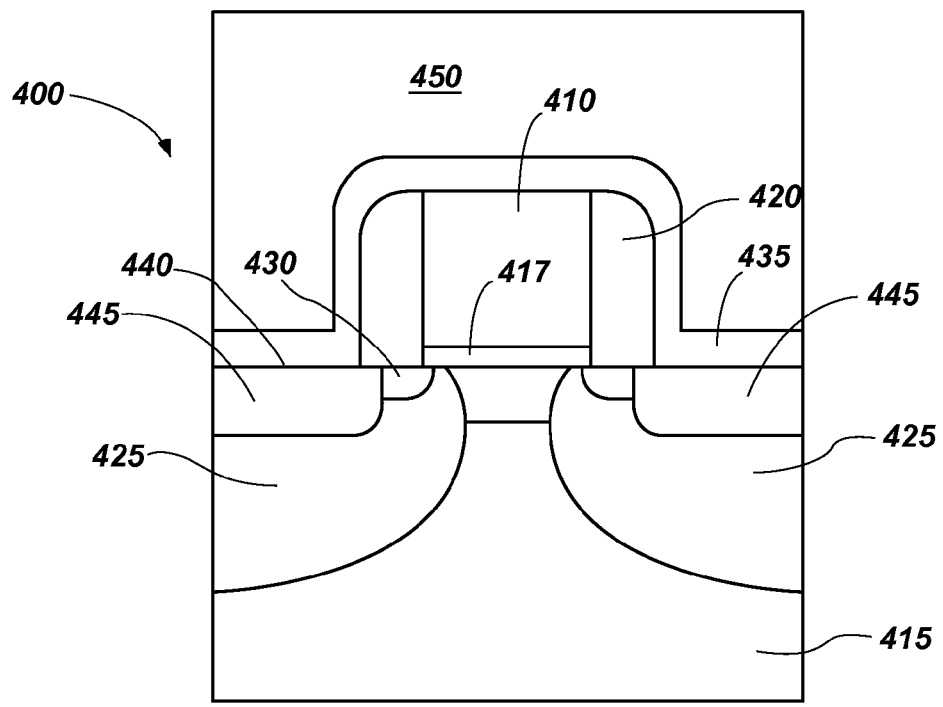

In act 330 (FIG. 3), a dielectric 450 (FIG. 4C) is formed over the semiconductor substrate 415 and the oxide layer 435, including over and between any gates 410 that may be adjacent to each other. Referring to FIG. 4C, an elevation cross-sectional view of the substrate 415 is illustrated. The dielectric 450 may be formed over and between adjacent gates 410 to electrically isolate devices from each other. As used herein, a device may comprise a transistor including one or more diffusion regions 445 having a gate 410 adjacent the one or more diffusion regions 445. By way of example and not limitation, the dielectric 450 may comprise a doped silicate glass, such as borosilicate glass (BSG), phosphosilicate glass (PSG), and borophosphosilicate glass (BPSG). The dielectric 450 may be formed using, for example, a CVD process.

In act 340 (FIG. 3), the dielectric 450 may also be subjected to a high temperature annealing process, such as to densify the dielectric 450, as well as to activate the ion implants and remove damage induced by the ion implantation in the substrate 415. For example, in one embodiment using BPSG for dielectric 450, the BPSG material is annealed after being formed over the substrate 415. An annealing process for BPSG may include utilizing rapid thermal processing (RTP) or a furnace annealing process. Such an annealing process may include exposing the BPSG to temperatures of about 650° C. for a relatively short time period such as, for example, 10 minutes.

Figure 4D:
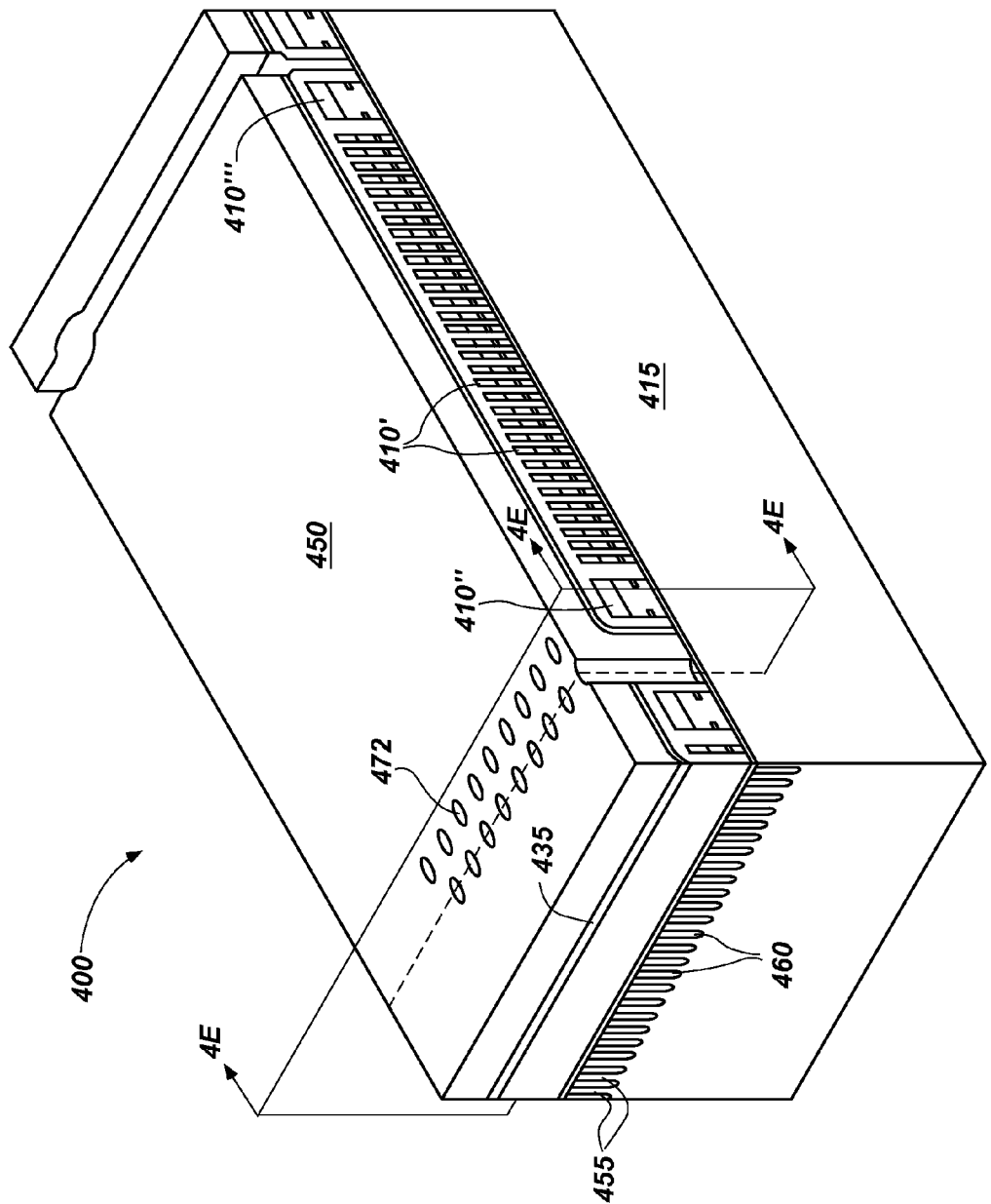

FIG. 4D is an isometric sectional view of semiconductor device 400 resulting from the foregoing processes as described herein with reference to FIG. 3. The semiconductor device 400 includes the substrate 415 with a plurality of gates 410 and a plurality of active areas 455 comprising a plurality of diffusion regions 445 (FIG. 4C) between gates 410. The active areas 455 of the plurality of active areas 455 are electrically isolated by shallow trench isolation (STI) regions 460 between active areas 455 positioned next to each other. The gates 410 may comprise control gates 410' located between a select gate drain 410" and a select gate source 410'". As set forth herein above, the semiconductor device 400 further includes an oxide layer 435 and dielectric 450. As further shown in FIG. 4D, a plurality of openings 472 may be subsequently formed in the dielectric 450 down to the active areas 455. These openings 472 may be filled with a conductive material to form a plurality of data line contacts, such as bit contacts, to couple certain diffusion regions 445 (FIG. 4C) to conductive data lines of the semiconductor device 400, as is generally known to those of ordinary skill in the art.

Figure 4E:
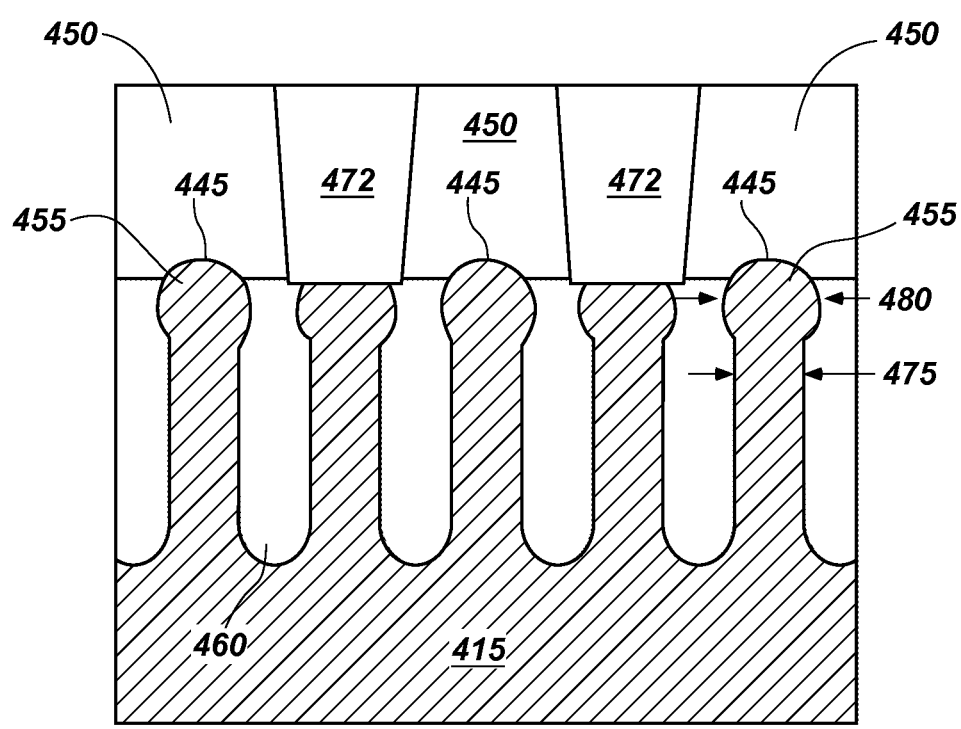

FIG. 4E is a partial view of a cross-section of the semiconductor device 400 taken through the plane 4E-4E of FIG. 4D and illustrating some of the active areas 455. As used herein, the active areas 455 refers to the portions of the semiconductor device 400 that are separated by STI regions and include the diffusion regions 445, as well as a channel extending below the control gates 410'. Employing the foregoing processes as described herein and in the order set forth in FIG. 3 in which the oxide layer 435 is formed prior to implanting the ions, the mushrooming described herein above may be reduced. For example, in one embodiment, the active areas 455 may have an average width 475 of about thirty (30) nanometers or less. In such embodiments, the width 480 of the resulting mushroom may comprise an increase in width from the original width 475 of about 16.5% or less. The structure resulting from act 340 includes a semiconductor device 400 having at least two diffusion regions 445 separated by an STI region 460 such as, for example, a memory device having an array of diffusion regions 445 in the active areas 455. The at least two diffusion regions 445 of the semiconductor device 400 have an increase in width at a proximal end of about 16.5% or less from the original width 475. In other words, the at least two diffusion regions 445 comprise a first width at a depth (e.g., about 30-40 nanometers or more below the surface 440) within the substrate 415 (referred to herein as the original width 475, since it is a width of the diffusion regions 445 when they are initially formed, and without any mushrooming effect caused by subsequent processing) and a second width near a surface of the semiconductor substrate 415 (referred to herein as the width 480 of the resulting mushroom), wherein the second width is about 16.5% greater or less than the first width.

In a further embodiment, the semiconductor device 400 may be exposed to processing steps for reducing nucleation of the substrate material and for enhancing grain growth of the substrate material. For example, act 340 may comprise a modified annealing process for annealing dielectric 450, the modified annealing process configured to promote grain growth, rather than nucleation, of the substrate material. The modified annealing process may comprise a temperature spike annealing process in which the temperature is ramped up to a peak temperature and then reduced from the peak temperature without any significant delay. In at least one embodiment, the temperature spike annealing process may utilize a Rapid Thermal Process (RTP) in which the dielectric 450 is exposed to a first temperature for a period of time sufficient to stabilize the temperature of the semiconductor device 400. The temperature is then rapidly ramped up to a substantially greater peak temperature that will more favorably promote growth of existing grains instead of nucleation of new grains. Once the temperature reaches the peak temperature, the temperature is quickly lowered to a substantially lower temperature. The peak temperature, in some embodiments, is a temperature greater than about 1,050° C. By way of example and not limitation, the peak temperature in some embodiments may be between 1,050° C. and 1,200° C., which may be held for about two (2) seconds or less.

Figure 5:
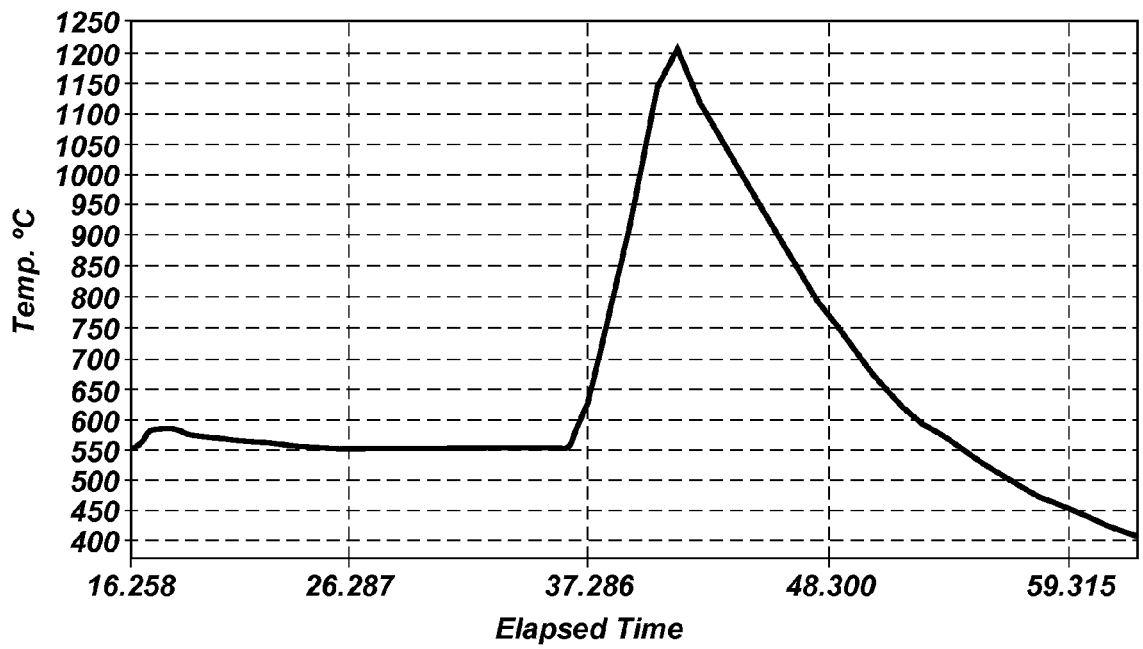
FIG. 5 illustrates a graph of temperature (on the y-axis) as a function of elapsed time (on the x-axis) in accordance with an embodiment of a modified annealing process of the present disclosure.

FIG. 5 illustrates a graph depicting the temperature on the y-axis and an elapsed time on the x-axis for an embodiment of a modified annealing process of the present disclosure. As illustrated, the dielectric 450 is exposed to a temperature between about 550° C. and 600° C. for an initial period of time. For example, the dielectric 450 may be exposed to a temperature between about 550° C. and 600° C. for less than about one (1) minute. The temperature is then ramped up at a relatively rapid rate to about 1,200° C. over the course of about five (5) seconds (e.g., at an average rate of about 125° C. per second). Once the temperature reaches the peak temperature, 1,200° C. in this example, the temperature is lowered. For example, in at least one embodiment, the temperature is lowered to between about 400° C. and 700° C. at either a controlled or uncontrolled rate. The device may then be transferred to another cooling stage in room air to further cool to room temperature.

Employing the processes described herein as set forth in FIG. 3, and the modified annealing process described with reference to FIG. 5, the mushrooming described above may be at least substantially eliminated. For example, in one embodiment, the width 480 (FIG. 4E) at the proximal end of the substrate material may comprise substantially no increase in width, such that the entire longitudinal length thereof has an at least substantially constant width 475. The resulting structure includes a semiconductor device 400 having one or more diffusion regions 445 such as, for example, a memory device having an array of diffusion regions 445. The diffusion regions 445 of the semiconductor device 400 have at least substantially no increase in width at a proximal end from the original width 475. In other words, the diffusion regions 445 comprise a first width (e.g., original width 475) and a second width (e.g., width 480) that are at least substantially equal (e.g., there is no mushroom).

Figure 6:
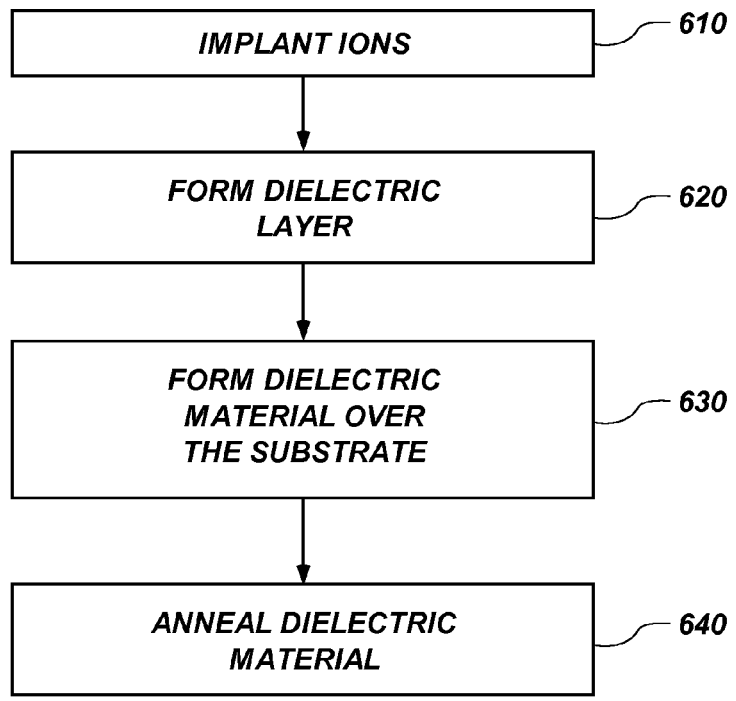
FIG. 6 is a flow diagram illustrating the process flow of another embodiment of a method of the present disclosure.
Figure 7A:
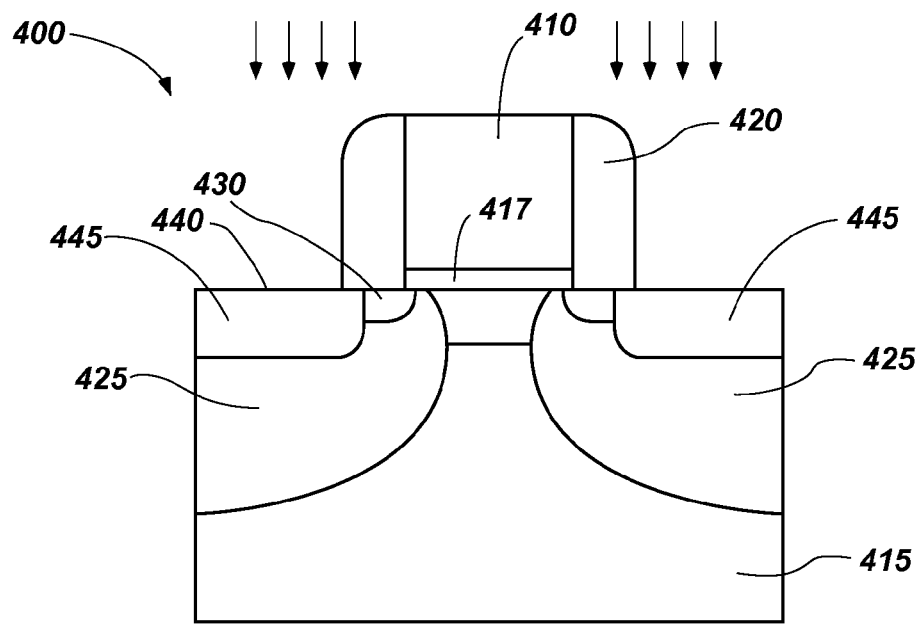
FIGS. 7A through 7D illustrate the associated structures formed during the method of FIG. 6.

Process flow of an embodiment of another method of the present disclosure is illustrated in FIG. 6, and the associated structures formed during the process are illustrated in FIGS. 7A through 7D. FIG. 7A is a cross-sectional elevation view of a portion of an N-channel transistor, such as one used to form a select gate, of a semiconductor device 400 during a stage of fabrication after several processing steps have occurred according to an embodiment of the present disclosure. Formation of the structure depicted in FIG. 7A is known to those of ordinary skill in the art and will not be detailed herein. In general, a gate 410, such as a select gate, may be formed adjacent to a semiconductor, such as semiconductor substrate 415, for example of silicon, such as a single crystal silicon substrate. For example, the gate 410 may comprise N+ doped polycrystalline silicon over the substrate 415, and separated therefrom by a gate oxide 417. A spacer 420 is formed on lateral sides of the gate 410. A plurality of halo implant regions 425 and LDD implant regions 430, such as the P halo and N-LDD regions of an N-channel transistor, are formed in the substrate 415. Other conventional features may also be formed in, on or over the substrate 415 according to various embodiments for semiconductor devices.

Referring to the drawing figures, in act 610 (FIG. 6), ions are implanted into selected regions of the substrate 415 (FIG. 7A) to complete the formation of the sources and drains. The ion implantation may comprise a relatively shallow implant of a large number (i.e., a high-dose) of ions to complete formation of diffusion regions 445. The ion implantation is accomplished using ion implantation equipment and techniques known in the art. Generally, a mask (not shown) may be formed and patterned over the surface 440 with a plurality of openings formed therein to selectively specify the locations for a plurality of diffusion regions 445. An ion beam is directed at the substrate 415 and the ions are implanted in the substrate 415 to a relatively shallow depth and with a high concentration to provide an excess of current carriers. As a result, the diffusion regions 445 are electrically conductive. By way of example and not limitation, the ion beam may comprise Arsenic or $BF_2$ (depending on whether it is an N-channel or P-channel transistor). The mask formed on the surface 440 may be removed after the ions are implanted into the diffusion regions 445. The resulting structure after act 610 may comprise a plurality of diffusion regions 445 in the surface 440 of the substrate 415 and adjacent to the gate 410. The plurality of diffusion regions 445 comprise the sources and drains used for conventional transistors.

Figure 7B:
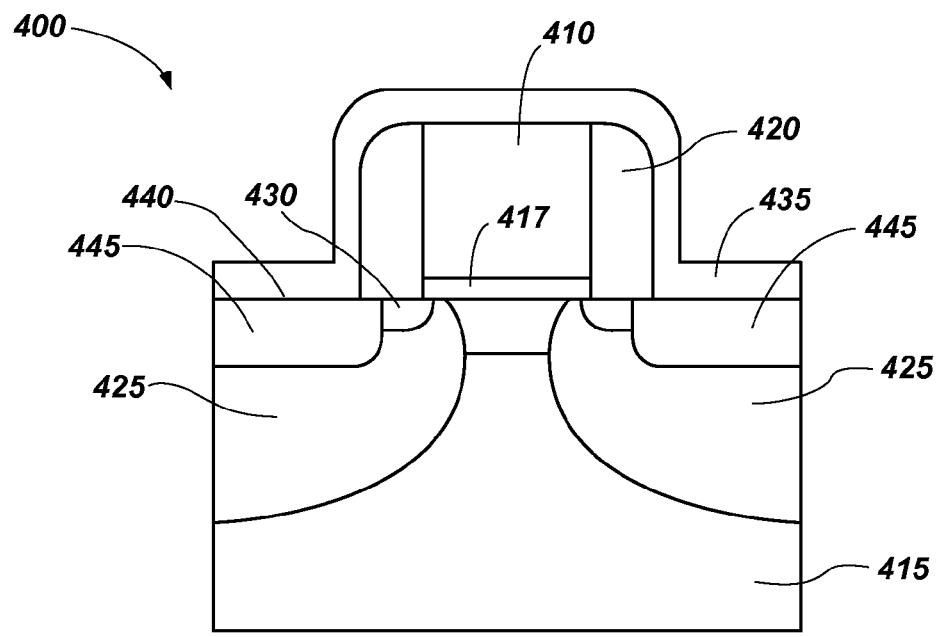

In act 620 (FIG. 6), and with reference to FIG. 7B, an oxide layer 435 is formed over the gates 410 and the substrate 415. The oxide layer 435 may be formed as a screening oxide, such as to protect the substrate 415 from residual ions on the surface 440 of the substrate 415 after the ion implantation of act 610. The oxide layer 435 may comprise an oxide film such as silicon dioxide formed to a thickness of about 15 nanometers. The oxide layer 435 may be formed by conventional methods including, for example, CVD using TEOS deposition. Prior to forming the oxide layer 435, the surface 440 of the substrate 415 may be cleaned as is generally known in the art.

Figure 7C:
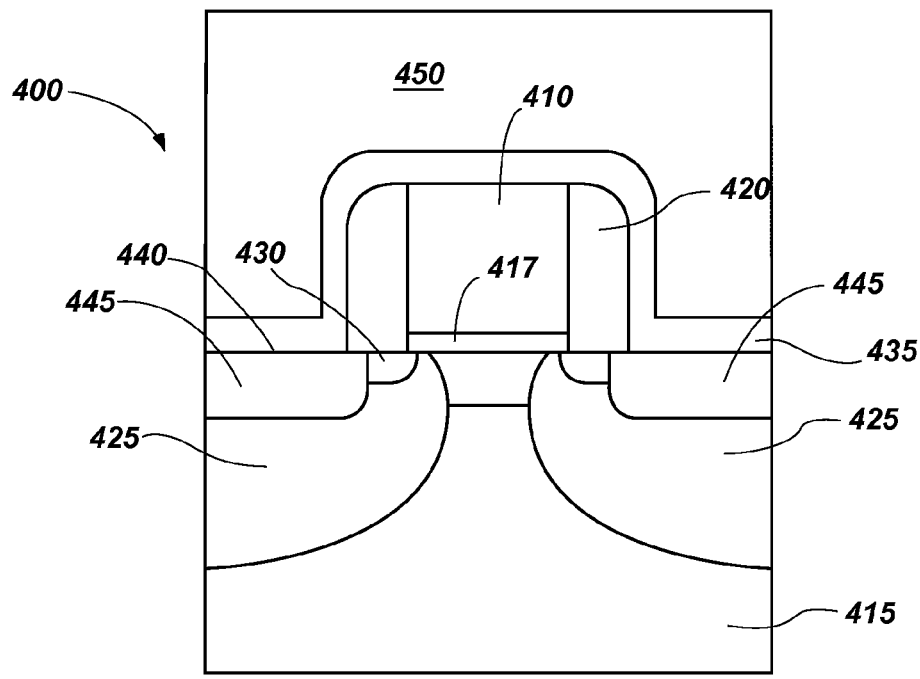

In act 630, a dielectric 450 is formed over the semiconductor substrate 415 and the oxide layer 435, including over and between any gates 410 that may be adjacent to each other. Referring to FIG. 7C, an elevation cross-sectional view of the substrate 415 is illustrated. The dielectric 450 may be formed over and between any adjacent gates 410 to electrically isolate devices from each other. By way of example and not limitation, the dielectric 450 may comprise a doped silicate glass, such as borosilicate glass (BSG), phosphosilicate glass (PSG), and borophosphosilicate glass (BPSG). The dielectric 450 may be formed using, for example, by a conventional CVD process.

As described above, the semiconductor device 400 may be exposed to processing steps which will reduce nucleation of the substrate material and enhance grain growth of the substrate material. For example, act 640 may comprise subjecting the dielectric 450 to a modified annealing process, such as a temperature spike annealing process that is configured to promote grain growth, rather than nucleation, of the substrate material. In at least one embodiment, the temperature spike annealing process may comprise the process described above with reference to FIG. 5. The temperature spike annealing process described above may utilize an RTP in which the dielectric 450 is exposed to a first temperature for a period of time sufficient to stabilize the temperature of the semiconductor device 400. The temperature is then rapidly ramped up to a substantially greater peak temperature that will more favorably promote growth of existing grains instead of nucleation of new grains. Once the temperature reaches the peak temperature, the temperature is quickly lowered to a substantially lower temperature. The peak temperature, in some embodiments, is a temperature greater than about 1,050° C. By way of example and not limitation, the peak temperature in some embodiments may be between 1,050° C. and 1,200° C., and may be held for a period of two (2) seconds or less.

In the example described with reference to FIG. 5, the dielectric 450 is exposed to a temperature between about 550° C. and 600° C. for an initial period of time (e.g., less than about one (1) minute). The temperature is then ramped up at a substantially quick rate to about 1,200° C. For example, in the illustrated embodiment, the temperature is ramped up from about 550° C. to about 1,200° C. over the course of about five (5) seconds (e.g., at an average rate of about 125° C. per second). Once the temperature reaches the peak temperature, 1,200° C. in this example, the temperature is lowered. For example, in at least one embodiment the temperature is lowered to between about 400° C. and 700° C. at either a controlled or uncontrolled rate. The device may then be transferred to another cooling stage in room air to further cool to room temperature.

Figure 7D:
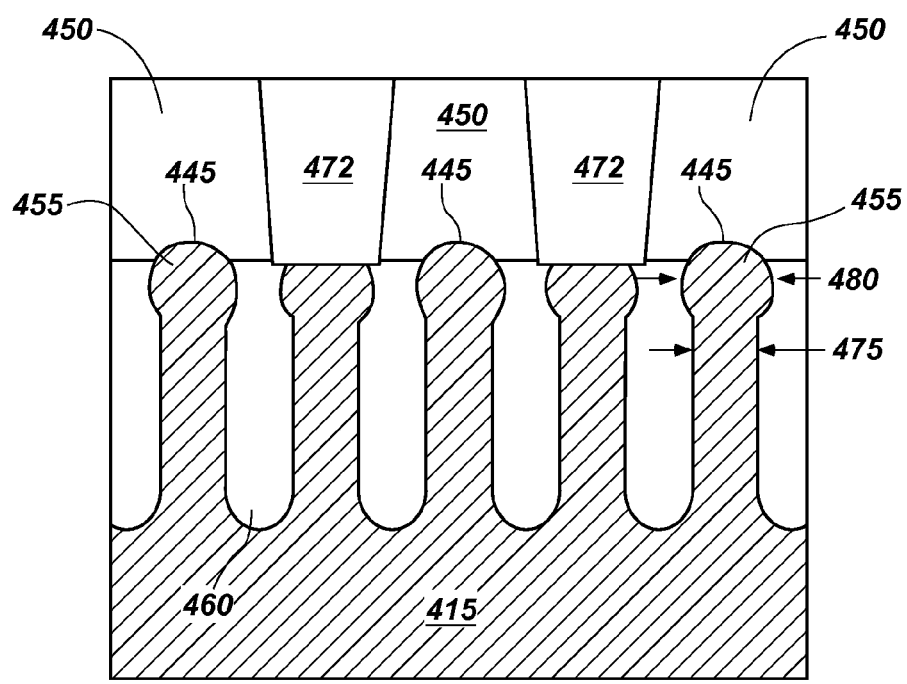

FIG. 7D is a partial view of a cross-section of the substrate 415 similar to FIG. 4E illustrating some of the active areas 455 of FIG. 4D. Employing the foregoing processes as described herein and in the order set forth in FIG. 6 in which the dielectric material 450 is exposed to a temperature spike annealing process, such as that described above with reference to FIG. 4, the mushrooming described herein above may be reduced. For example, in one embodiment, the active areas 455 may comprise an average width 475 of about thirty (30) nanometers or less. In such embodiments, the width 480 of the resulting mushroom comprises an increase in width from the original width 475 of about 39% or less. The structure resulting from act 640 includes a semiconductor device 400 having at least two diffusion regions 445 separated by an STI region 460 such as, for example, a memory device having an array of diffusion regions 445 in the active areas 455. The two or more diffusion regions 445 of the semiconductor device 400 have an increase in width at a proximal end of less than about 40% from the original width 475. In other words, the two or more diffusion regions 445 comprise a first width at a depth (e.g., about 30-40 nanometers or more below the surface 440) within the substrate 415 (e.g., the original width 475) and a second width near a surface of the semiconductor substrate 415 (e.g., the width 480 of the resulting mushroom), wherein the second width is greater than the first width by less than about 40%.

Figure 8:
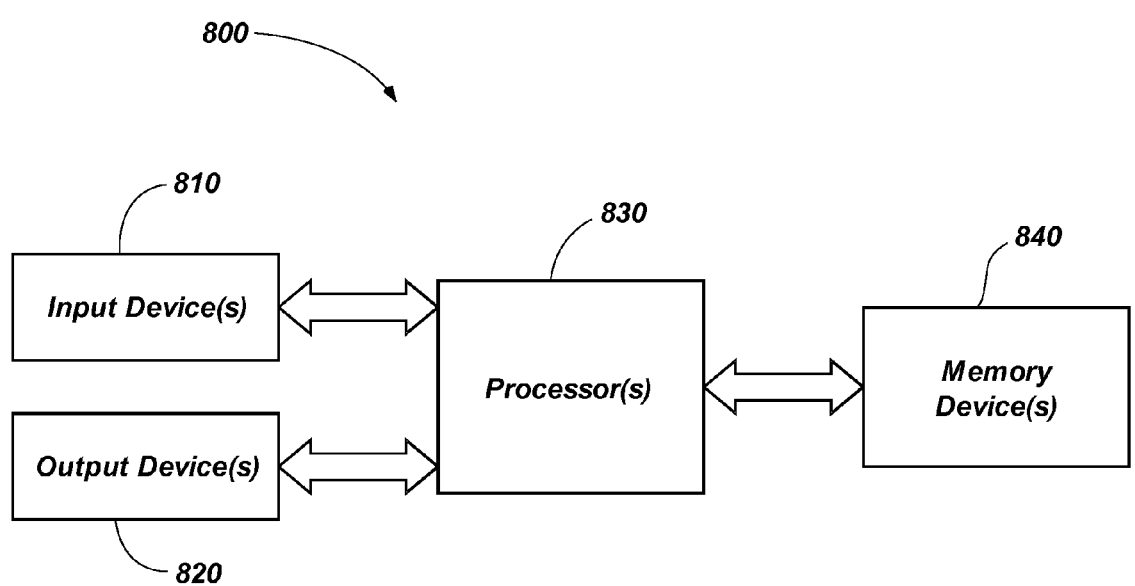
FIG. 8 is a schematic diagram of a computing system showing at least one semiconductor memory device containing diffusion regions according to at least one embodiment of the present disclosure.

Further embodiments of the present disclosure are directed to systems comprising one or more memory devices. As shown in FIG. 8, an electronic system 800, such as a computer system, in accordance with an embodiment of the present invention, comprises at least one input device 810, at least one output device 820, and at least one memory device 840 each electrically coupled to at least one electronic signal processor 830. As used herein, the term "computer system" includes not only computers such as personal computers and servers, but also wireless communication devices (e.g., cell phones, personal digital assistants configured for text messaging and email), cameras, chip sets, set top boxes, controllers, vehicle and engine control and sensor systems, digital music players, and other combinations of the above-referenced input, output, processor and memory devices. The one or more memory devices 840 comprises at least one memory device (e.g., semiconductor device 400) comprising two or more diffusion regions comprising a width of about 30 nanometers or less and exhibiting an increase in width at a proximal end thereof of less than about 40%. The at least one memory device 840 may comprise any conventional programmable memory device. By way of example and not limitation, the at least one memory device 840 may comprise a Flash memory device or a CMOS memory device.

CONCLUSION

Various embodiments of the present disclosure are described above and comprise methods of forming a semiconductor device. One or more embodiments of such methods may comprise forming an oxide over a semiconductor and a gate adjacent to the semiconductor. Ions may be implanted into at least a portion of the semiconductor through the oxide, faulting a plurality of diffusion regions in the semiconductor. A dielectric may be formed over the oxide and the dielectric may be annealed.

In other embodiments, such methods may comprise implanting ions into a semiconductor. At least one diffusion region may be formed in the semiconductor and adjacent to a respective side of a gate formed adjacent to the semiconductor. An oxide may be formed over a surface of the semiconductor, including over the at least one diffusion region. A dielectric material may be formed over the semiconductor and the oxide, and the dielectric may be annealed with a temperature spike annealing process.

Still further embodiments of the present disclosure comprise semiconductor devices comprising at least two diffusion regions in a semiconductor substrate. Each diffusion region may be adjacent to a respective one of at least two gates fainted adjacent to a surface of the semiconductor. The diffusion regions comprise a first width at a depth below the surface of the semiconductor and a second width near the surface of the semiconductor. The second width of at least some of the diffusion regions is less than about 40% greater than the first width.

Other embodiments of the disclosure comprise semiconductor devices comprising a plurality of diffusion regions in a semiconductor, each diffusion region being adjacent to a respective one of a plurality of gates formed adjacent to a surface of the semiconductor. The diffusion regions comprise a first width of about 30 nanometers or less at a depth below the surface of the semiconductor and a second width near the surface of the substrate. The second width of at least some of the diffusion regions is less than about 40% greater than the first width.

While certain embodiments have been described and shown in the accompanying drawings, such embodiments are merely illustrative and not restrictive of the scope of the disclosure, and this disclosure is not limited to the specific constructions and arrangements shown and described, since various other additions and modifications to, and deletions from, the described embodiments will be apparent to one of ordinary skill in the art. Thus, the scope of the disclosure is only limited by the literal language, and legal equivalents, of the claims which follow.

What is claimed is:

1. A method of forming a semiconductor device, comprising:
    implanting ions into a semiconductor, wherein at least one diffusion region is formed in the semiconductor, and wherein the at least one diffusion region is adjacent to a side of a gate formed adjacent to the semiconductor;
    forming an oxide over a surface of the semiconductor, including over the at least one diffusion region;
    forming a dielectric over the semiconductor and the oxide;
    annealing the dielectric with a temperature spike annealing process;
    forming at least one opening in the dielectric extending to the at least one diffusion region; and
    filling the at least one opening with a conductive material.

2. The method of claim 1, wherein forming the oxide comprises forming the oxide with a thickness of about 15 nanometers.

3. The method of claim 1, further comprising cleaning the surface of the semiconductor prior to forming the oxide thereover.

4. The method of claim 1, wherein annealing the dielectric with a temperature spike annealing process comprises ramping up the temperature to a temperature for promoting grain growth of the semiconductor rather than nucleation of the semiconductor.

5. The method of claim 4, wherein ramping up the temperature to a temperature for promoting grain growth of the semiconductor comprises ramping up the temperature to a temperature above 1,050° C.

6. The method of claim 1, wherein implanting ions into a semiconductor, wherein at least one diffusion region is formed in the semiconductor comprises forming source and drain regions in the semiconductor.

7. The method of claim 1, wherein implanting ions into a semiconductor comprises implanting ions at an energy level greater than about 30 KeV.

8. The method of claim 1, wherein forming an oxide over a surface of the semiconductor comprises forming an oxide with a thickness of about 15 nanometers.

9. The method of claim 1, wherein forming an oxide over a surface of the semiconductor comprises forming the oxide by chemical vapor deposition using tetraethyl orthosilicate.

10. The method of claim 1, wherein forming an oxide over a surface of the semiconductor, including over the at least one diffusion region, comprises forming silicon dioxide over surfaces of the substrate and the at least one diffusion region.

11. The method of claim 1, wherein forming a dielectric over the semiconductor and the oxide comprises forming a dielectric comprising a doped silicate glass.

12. The method of claim 1, wherein annealing the dielectric with a temperature spike annealing process comprises exposing the dielectric to a maximum temperature of about 1,200° C.

13. The method of claim 1, wherein annealing the dielectric with a temperature spike annealing process comprises exposing the dielectric to a first temperature and increasing the first temperature to reach a peak temperature at an average rate of about 125° C. per second.

14. The method of claim 1, further comprising exposing the dielectric and the semiconductor to a temperature of between about 550° C. and 600° C. for a period of time sufficient to stabilize a temperature of the semiconductor device prior to annealing the dielectric with a temperature spike annealing process.

15. The method of claim 1, further comprising forming a plurality of lightly doped drain implant regions under the gate.

16. A method of forming a semiconductor device, comprising:
    forming diffusion regions in a semiconductor substrate;
    forming an oxide over the semiconductor substrate and the diffusion regions;
    forming a dielectric conformally over the oxide; and
    subjecting the dielectric and the semiconductor substrate to a temperature spike annealing process, wherein a peak temperature of the temperature spike annealing process is held for about two seconds or less, promoting grain growth within the semiconductor substrate, and inhibiting nucleation of new grains within the semiconductor substrate.

17. The method of claim 16, further comprising forming at least one opening in the dielectric extending to at least one of the diffusion regions and filling the at least one opening with a conductive material.

18. A method of forming a semiconductor device, comprising:
   forming a gate structure on a substrate;
   implanting ions into the substrate to form diffusion regions in the substrate adjacent to sides of the gate structure;
   forming an oxide over the substrate, the gate structure, and the diffusion regions;
   forming a dielectric material over the oxide, the gate structure, and the diffusion regions;
   annealing the dielectric material with a temperature spike annealing process; and
   forming a data line contact through the dielectric material and coupling at least some of the diffusion regions to conductive data lines of the semiconductor device.

19. The method of claim 18, further comprising forming shallow trench isolation regions between adjacent diffusion regions to form an active region having an average width of 30 nanometers or less.

* * * * *